(12) United States Patent
Bertrand

(10) Patent No.: US 7,102,252 B2
(45) Date of Patent: Sep. 5, 2006

(54) MULTI-FUNCTION SOLID-STATE SWITCH

(75) Inventor: Jeffrey J Bertrand, Hazel Green, AL (US)

(73) Assignee: Adtran, Inc., Huntsville, AL (US)

( * ) Notice: Subject to any disclaimer, the term of this patent is extended or adjusted under 35 U.S.C. 154(b) by 479 days.

(21) Appl. No.: 10/720,795

(22) Filed: Nov. 24, 2003

(65) Prior Publication Data

US 2005/0110349 A1 May 26, 2005

(51) Int. Cl.
*B23K 11/24* (2006.01)
*H02B 1/24* (2006.01)

(52) U.S. Cl. ...................... 307/112; 307/113
(58) Field of Classification Search ................ 307/112
See application file for complete search history.

(56) References Cited

U.S. PATENT DOCUMENTS 5,965,957 A * 10/1999 Bourgeois et al. .......... 307/116
6,759,851 B1 * 7/2004 Hazelton ..................... 324/522

* cited by examiner

*Primary Examiner*—Phuong T. Vu
*Assistant Examiner*—Carlos Amaya
(74) *Attorney, Agent, or Firm*—Allen, Dyer, Doppelt, Milbrath & Gilchrist, P.A.

(57) ABSTRACT

A dual solid state switch architecture has a plurality of control/monitor ports, selected ones of which are used to control the operation of a pair of power MOSFETs current flow paths through which are coupled to prescribed ones of a plurality of input/output ports that are adapted to be coupled to a circuit path containing a load and either and AC or DC power source therefor. Selected others of the control/monitor ports are used to monitor current delivered to the load. A leakage current by-pass resistor is connected between selected input/output ports, to which a neon tube may be connected for indicating the switching on of an AC source. This resistor serves to provide a bypass path for leakage current through the MOSFETs, so as to prevent the neon tube from being erroneously illuminated, when the MOSFETs have been turned off.

20 Claims, 7 Drawing Sheets

MULTI-FUNCTION SOLID-STATE SWITCH

FIELD OF THE INVENTION

The present invention relates to electronic circuits and components, and is particularly directed to a new and improved dual solid state switch architecture, having a plurality of control and monitor ports, selected ones of which may be used to control the operation of the switch and selected others of which may be used to monitor current flow delivered to a load. The switch also includes a plurality of input/output ports through which a user may selectively couple the load to either an AC or DC power source.

BACKGROUND OF THE INVENTION

In many test and evaluation applications it is necessary to control the application and/or interruption of one or more AC and DC sources to a load under test. Moreover, it is often the case that the amount of current consumed by a load should be monitored. Performing both of these tasks has typically required the use of separate and distinct interconnect and monitor components, such as a solid state AC switch or relay for controlling AC current, another type of switch controlling DC current, and additional circuitry used to monitor current flowing through the switch and the load.

In addition to these power supply and current monitoring functions, there is a need to prevent DC current from flowing backward through the switch when the switch is turned off. A further issue is the control current that turns on the solid-state switch, and the desire to provide a visual indication of the state of the switch, with the state of the switch being capable of being monitored from either its control or load side. Unfortunately, present day solid state switches have sufficient leakage current on the load side that can erroneously turn on a neon indicator, even through the switch has been turned off.

SUMMARY OF THE INVENTION

In accordance with the present invention, the above issues of conventional solid state switches, including those used for test applications, are successfully addressed by a new and improved, multiple function, solid state switch architecture that enjoys a very low insertion loss, and which is capable of switching either AC or DC voltages therethrough, while allowing current flow to a load to be readily monitored from the control side of the switch. The switch is also provided with an indicator that may be optionally wired to inform the user that a valid switch closure control signal has been applied to the switch.

For this purpose, the switch comprises an integrated arrangement of control/monitor ports, a plurality of input/output ports, and a dual power MOSFET switching arrangement coupled therebetween. The two MOSFETs are arranged so that their body diodes are in opposing directions to provide reverse current blocking functionality. Selected control ports are used to control the operation of (turn on and turn off of) the power MOSFETs by way of an opto-isolator circuit. A light emitting diode (LED) may be coupled with the turn on control ports to provide an indication of the application of a turn on voltage to the MOSFETs. Selected load-coupled input/output ports are coupled with resistor components, voltages drops across which may be monitored by associated ones of the control/monitor ports to derive a measure of load current. A leakage current by-pass resistor is connected between selected input/output ports, to which a neon tube may be connected for indicating the switching on of an AC source. This resistor serves to provide a bypass path for leakage current through the MOSFETs, so as to prevent the neon tube from being erroneously illuminated, when the MOSFETs have been turned off.

Owing to its integrated arrangement, the dual power MOSFET switching arrangement of the present invention is capable of performing a wide variety of functions. From a control standpoint, the MOSFETs may be turned off by way of either a low side or high side DC supply switch, with or without an LED indicator. From a load standpoint, the switch may be operated to close a path between a load and a DC supply therefor in accordance with a number of different circuit configurations. These include a low side or high side switch connection (through only one of the dual MOSFET pair) with nominal insertion loss of the drain-source resistance of only one of the MOSFETs, and a low side or high side switch connection (through both MOSFETs effectively connected in parallel) that provides a minimal insertion loss of the half the drain-source resistance of a MOSFET. Both MOSFETs may also be coupled in series (back-to-back) to provide reverse current blocking and nominal insertion loss. This connectivity may be afforded for either high side or low side DC switching.

DC load current may be monitored (as by means of a digital multi-meter coupled to selected control/monitor ports) for either a low side or high side input/output connection, and for either minimal or nominal insertion loss. In the case of nominal insertion loss mode, both MOSFETs may be coupled in series (back-to-back) to provide reverse current blocking. A line side AC switch connection may be effected with nominal insertion loss and with or without any current monitor. Also a neutral side AC switch connection may be performed. Where a neon tube is provided for AC switching applications, it may be coupled across the leakage current by-pass resistor.

BRIEF DESCRIPTION OF THE DRAWINGS

FIG. 22 diagrammatically illustrates the manner in which a (neon) lamp indicator may coupled with the input/output ports to provide an indication of whether the switch for the dual MOSFET switch of FIG. 1 is turned on;

DETAILED DESCRIPTION

Figure 1:
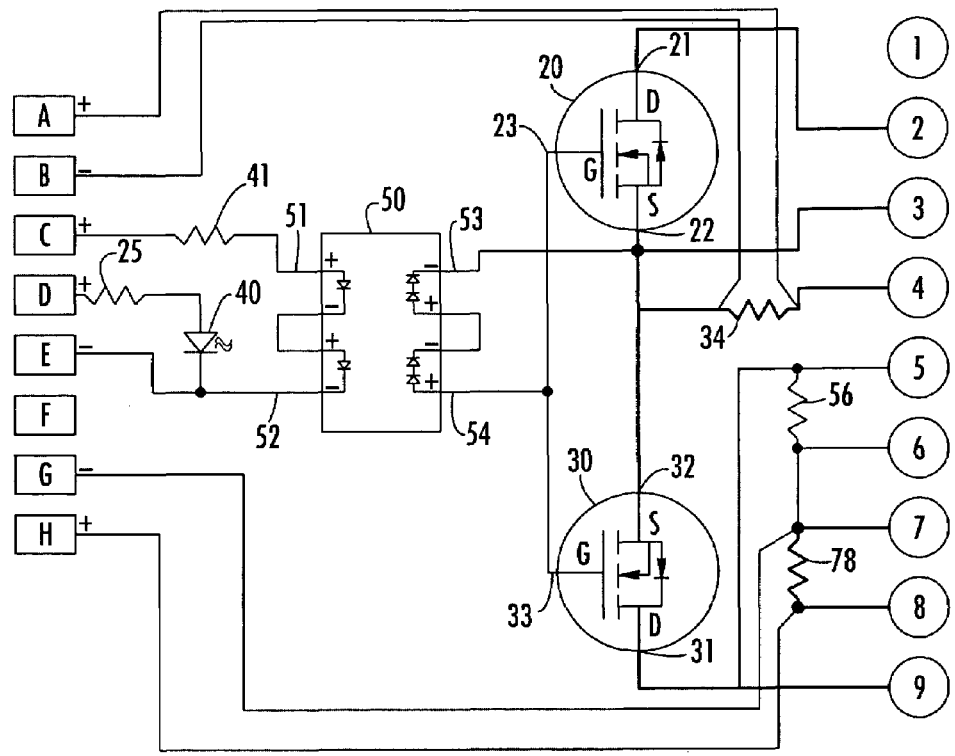
FIG. 1 is a schematic illustration of the overall configuration of a dual solid state switch architecture according to the present invention.

Attention is now directed to FIG. 1, wherein the overall configuration of the dual solid state switch architecture according to the present invention is diagrammatically illustrated as comprising a plurality (eight in the present embodiment) of control/monitor ports A-H, and a plurality (nine in the present embodiment) of input/output ports 1–9. Of the eight available control/monitor ports A–H, monitor ports A, B are used to monitor current flowing into/out of input/output port 4, while monitor ports G, H are used to monitor current flowing between input/output ports 7 and 8. Control ports C and E are used to control the operation of a pair of power MOSFETs 20 and 30 of the switch, proper, while control port D is coupled through a resistor 25 and is used to energize an associated indicator (LED 40) to indicate that the MOSFETs are being driven to their on or closed state. Port F constitutes an unused spare.

Of the eight available input/output ports, port 1 constitutes an unused spare. Input/output ports 2 and 3 are intended to be coupled to a source/load, while port 4 is a current-monitoring terminal. Ports 5 and 6 have a resistor 56 connected therebetween and are selectively coupled to an AC indicator (such as a neon tube). As will be described resistor 56 serves to provide a bypass path for leakage current through the MOSFETs, so as to prevent the neon tube from being erroneously illuminated, when the MOSFETs have been turned off. Port 5 may also be coupled to a source/load. Ports 7 and 8 have a resistor 78 connected therebetween and are used to measure current flow via a source/load. Port 9 is intended to be coupled to a source/load.

A first solid state switching device in the form of a power MOSFET 20 has a first input/output (drain) node 21 thereof coupled to input/output port 2, and a second input/output node 22 thereof coupled to input/output port 3 and through a resistor 34 to input/output port 4. Node 22 of MOSFET 20 is also coupled in common with a node 32 of a second power MOSFET 3. MOSFET 20 has its gate or control node 23 coupled in common with the gate 33 of power MOSFET 30, which has a first input/output node 31 thereof coupled to input/output port 9 and to input/output port 5. These MOSFET connections effectively place their body diodes in opposing directions, as shown. As will be described below, this servers to provide reverse current blocking functionality.

Control of the operation of MOSFETs 20 and 30 is effected by way of a solid state switching device driver circuit 50, preferably implemented as an opto isolator circuit, as shown. In particular, opto isolator circuit 50 has a first control terminal 51 thereof coupled via a resistor 41 to control port C, and a second control terminal 52 thereof coupled to control port E. Opto-isolator circuit has a first output terminal 53 thereof coupled to node 22, and a second output terminal 54 thereof coupled to the commonly connected control nodes 23 and 33 of MOSFETs 20 and 30 respectively.

Operation of the solid state switching architecture of FIG. 1 may be readily understood with reference to FIGS. 2–24, which show various circuit terminations that may be used for controlling the operation of, and monitoring external circuits that are coupled to the dual solid state switching device of FIG. 1. In order to reduce the complexity of the drawings, in each of FIGS. 2–24, the schematic illustration of FIG. 1 has been simplified as a block, retaining the control/monitor ports A—H, as well as the input/output ports 1–9. Those ports of the switch of FIG. 1 which are coupled to external circuit identified in FIGS. 2–24 by filling-in or darkening appropriate port symbols.

LOW SIDE TURN-ON OF MOSFET SWITCH WITHOUT INDICATOR (FIG. 2)

Figure 2:
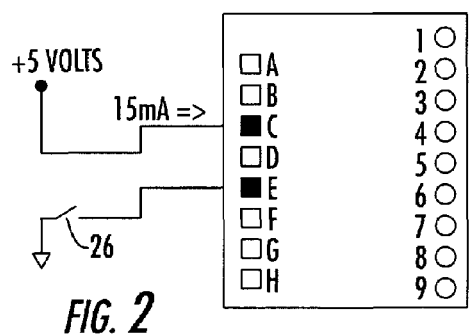
FIG. 2 diagrammatically illustrates the manner in which the duel MOSFET switch of FIG. 1 may be turned on via a low side switch, but without providing an indication that a turn-on voltage has been applied.

FIG. 2 diagrammatically illustrates the manner in which the dual MOSFET switch of FIG. 1 may be turned on via a low side switch, but without an indication that a turn-on voltage has been applied to the MOSFETs. In particular, control port C is coupled to an external power source rail (e.g., +5 volts), while control port E is coupled through an external switch 26 to a low side voltage (e.g., ground (GND)). With reference to FIG. 1, closure of low side switch 26 provides a current flow path from the external power source rail to port C through resistor 41—terminals 51 and 52 of opto-isolator 50—port C and then through (closed) switch 26 to ground. With opto-isolator turned on, its output 54 supplies a common gate voltage to each of MOSFETs 20 and 30, so that both MOSFETs 20 and 30 are turned on. There is no indication that a turn-on voltage has been applied to the MOSFETs, since control port D is open.

LOW SIDE TURN-ON OF MOSFET SWITCH WITH INDICATOR (FIG. 3)

Figure 3:
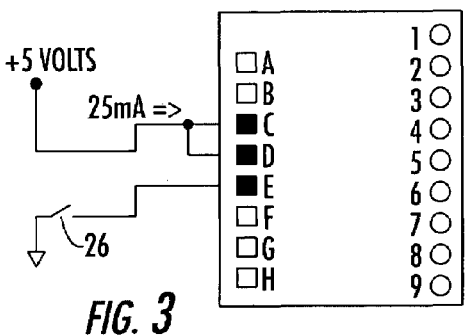
FIG. 3 diagrammatically illustrates the manner in which the dual MOSFET switch of FIG. 1 may be turned on via a low side switch, while also providing an indication that a turn-on voltage has been applied.

FIG. 3 diagrammatically illustrates the manner in which the dual MOSFET switch of FIG. 1 may be turned on via a low side switch and also with an indication that a turn-on voltage has been applied to the two MOSFETs. For this purpose both control port C and control port D are coupled in common to an external power source rail (e.g., +5 volts). As in FIG. 2, control port E is coupled through an external switch 26 to a low side voltage (e.g., ground (GND)). With reference to FIG. 1, closure of low side switch 26 now provides a current flow path from the external power source rail to each of port C through resistor 41 and port D through resistor 25 and LED to terminals 51 and 52 of opto-isolator 50—port C and then through (closed) switch 26 to ground. With opto-isolator turned on, its output 54 supplies a common gate voltage to each of MOSFETs 20 and 30, so that both MOSFETs 20 and 30 are turned on. With port D coupled in common with port C there is a current flow path through LED 40, causing the LED to be illuminated and providing an indication of a turn-on voltage to the switch.

HIGH SIDE TURN-ON OF MOSFET SWITCH WITHOUT INDICATOR (FIG. 4)

Figure 4:
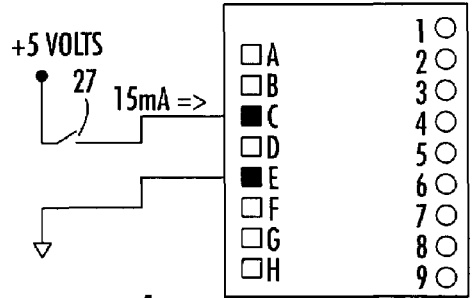
FIG. 4 diagrammatically illustrates the manner in which the dual MOSFET switch of FIG. 1 may be turned on via a high side switch, but without indicating that a turn-on voltage has been applied.

FIG. 4 diagrammatically illustrates the manner in which the dual MOSFET switch of FIG. 1 may be turned on via a high side switch, but without an indication that a turn-on voltage has been applied to the MOSFETs. In effect, this mode is complementary of the turn on method of FIG. 2. For high side switch control, control port C is coupled via a high side switch 27 to an external power source rail (e.g., +5 volts), while control port E is directly coupled to GND. With reference to FIG. 1, closure of such a high side switch provides a current flow path from the external power source rail through the switch to port C and resistor 41, through the circuit of terminals 51 and 52 of opto-isolator 50 to port C and then to ground. This turns on the opto-isolator 50, so that output 54 supplies a common gate voltage to each of MOSFETs 20 and 30, turning them on. There is no indication that a turn-on voltage has been applied to the MOSFETs, since control port D is open.

HIGH SIDE TURN-ON OF MOSFET SWITCH WITH INDICATOR (FIG. 5)

Figure 5:
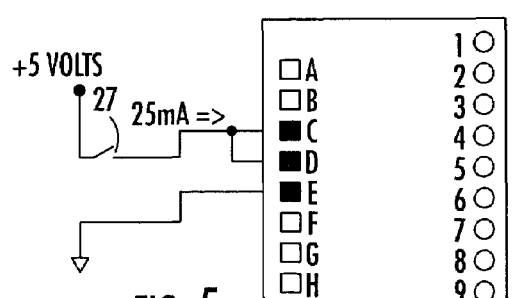
FIG. 5 diagrammatically illustrates the manner in which the dual MOSFET switch of FIG. 1 may be turned on via a high side switch and also indicating that a turn-on voltage has been applied.

FIG. 5 diagrammatically illustrates the manner in which the dual MOSFET switch of FIG. 1 may be turned on via a high side switch and also with an indication that a turn-on voltage has been applied to the two MOSFETs. As in the turn on method of FIG. 3, both control port C and control port D are coupled in common to switch 27, while control port E is coupled to GND. With reference to FIG. 1, closure of high side switch 27 now provides a current flow path from the external power source rail to each of port C through resistor 41 and port D through resistor 25 and LED to terminals 51 and 52 of opto-isolator 50—port C to ground. With opto-isolator turned on, its output 54 supplies a common gate voltage to each of MOSFETs 20 and 30, so that both MOSFETs 20 and 30 are turned on. With port D coupled in common with port C there is a current flow path through LED 46, causing the LED to be illuminated and providing an indication of a turn-on voltage to the switch.

LOW SIDE SECTION CONNECTION WITH NOMINAL INSERTION LOSS (FIG. 6)

Figure 6:
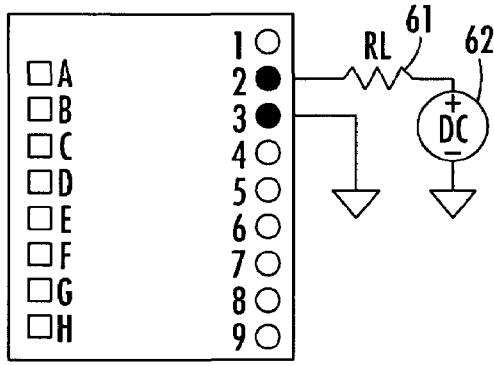
FIG. 6 diagrammatically illustrates the manner in which a low side output connection for the dual MOSFET switch of FIG. 1 may be effected with a nominal insertion loss of the drain-source resistance (Rdson) of a single MOSFET.

FIG. 6 diagrammatically illustrates the manner in which a low side output connection for the dual MOSFET switch of FIG. 1 may be effected with a nominal insertion loss of the drain-source resistance (Rdson) of a single MOSFET (e.g., MOSFET 20). In particular input/output port 2 is coupled to a unit under test, shown as a load resistor 61, in series with a DC supply 62, referenced to ground. In addition, input/output port 3 is coupled to ground. In this configuration, with MOSFET 20 turned on, a current flow path is provided from the DC supply 62 through the load resistor 61, to port 2, and the on resistance Rdson of MOSFET 20 and through port 3 to ground.

HIGH SIDE SWITCH CONNECTION WITH NOMINAL INSERTION LOSS (FIG. 7)

Figure 7:
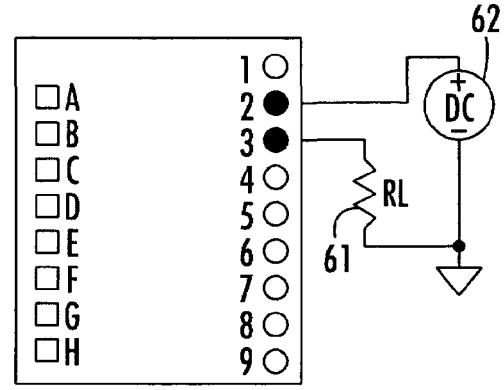
FIG. 7 diagrammatically illustrates the manner in which a high side output connection for the dual MOSFET switch of FIG. 1 may be effected with only a nominal insertion loss of the drain-source resistance (Rdson) of a single MOSFET.

FIG. 7 diagrammatically illustrates the manner in which a high side output connection for the dual MOSFET switch of FIG. 1 may be effected with only a nominal insertion loss of the drain-source resistance (Rdson) of a single MOSFET (e.g., MOSFET 20). In particular input/output port 2 is coupled to DC supply 62, referenced to ground. In addition, input/output port 3 is coupled through load resistor 61 to ground. In this configuration, with MOSFET 20 turned on, a current flow path is provided from the DC supply 62 through the on resistance Rdson of MOSFET 20 and through port 3 and load resistor 61 to ground.

LOW SIDE SWITCH CONNECTION WITH MINIMAL INSERTION LOSS (FIG. 8)

Figure 8:
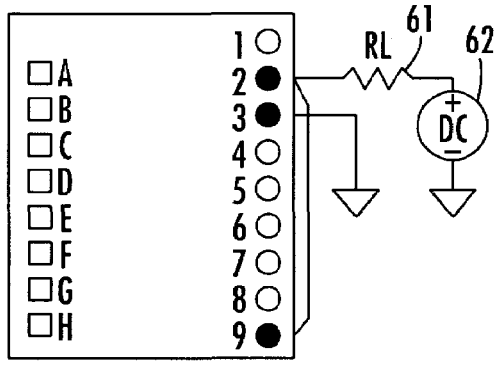
FIG. 8 diagrammatically illustrates the manner in which a low side output connection for the dual MOSFET switch of FIG. 1 may be effected with minimal insertion loss of the one-half the drain-source resistance (Rdson/2)

FIG. 8 diagrammatically illustrates the manner in which a low side output connection for the dual MOSFET switch of FIG. 1 may be effected with minimal insertion loss of the one-half the drain-source resistance (Rdson/2). In particular, in addition to the port connections of FIG. 6, described above, an additional connection is provided between input/output port 2 and input/output port 9. This has the effect of connection MOSFETs 20 and 30 in parallel, thereby halving the on resistance Rdson in the load current path.

HIGH SIDE SWITCH CONNECTION WITH MINIMAL INSERTION LOSS (FIG. 9)

Figure 9:
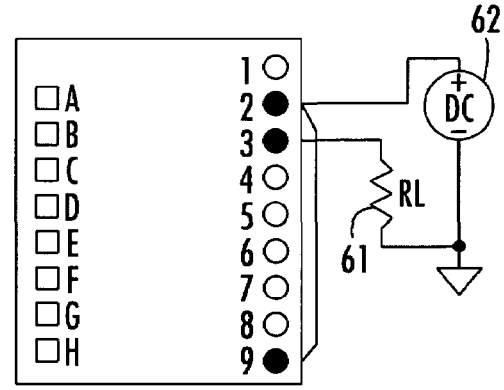
FIG. 9 diagrammatically illustrates the manner in which a high side output connection for the dual MOSFET switch of FIG. 1 may be effected with minimal insertion loss of the one-half the drain-source resistance (Rdson/2)

FIG. 9 diagrammatically illustrates the manner in which a high side output connection for the dual MOSFET switch of FIG. 1 may be effected with minimal insertion loss of the one-half the drain-source resistance (Rdson/2). In particular, in addition to the port connections of FIG. 7, described above, an additional connection is provided between input/output port 2 and input/output port 9, as in FIG. 8. Again, this has the effect of connecting MOSFETs 20 and 30 in parallel, thereby halving the on resistance Rdson in the load current path.

LOW SIDE SWITCH WITH REFERENCE CURRENT BLOCK (FIG. 10)

Figure 10:
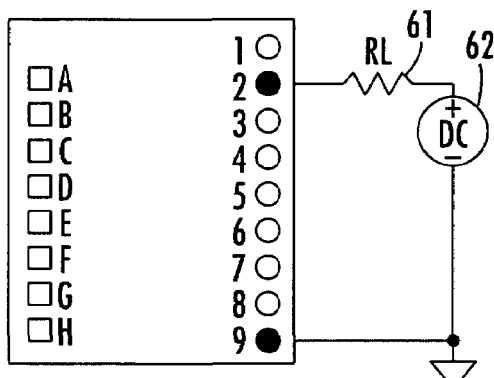
FIG. 10 diagrammatically illustrates the manner in which a low side output connection may be effected for the dual MOSFET switch of FIG. 1 with reverse current blocking and nominal insertion loss.

FIG. 10 diagrammatically illustrates the manner in which a low side output connection may be effected for the dual MOSFET switch of FIG. 1 with reverse current blocking and nominal insertion loss. As shown therein, input/output port 2 is coupled through load resistor 61 to DC supply source 62 (referenced to ground), while input/output port 9 is coupled to ground. This connection has the effect of placing the source-drain paths of the two MOSFETs 20 and 30 in series between input/output ports 2 and 9, so that the effective insertion resistance is 2Rdson. However, with the two MOSFETs in series, their body diodes are in opposite directions, as shown in FIG. 1, discussed above, thereby providing the intended reverse blocking functionality.

HIGH SIDE SWITCH WITH REVERSE CURRENT BLOCK (FIG. 11)

Figure 11:
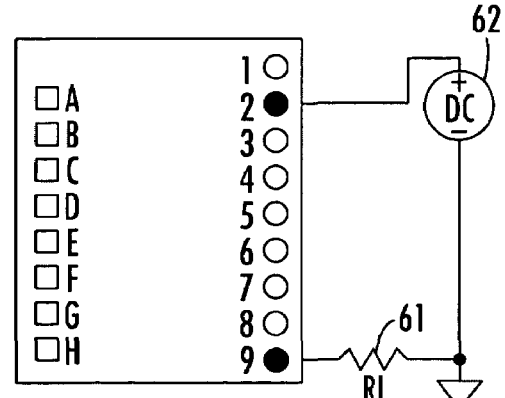
FIG. 11 diagrammatically illustrates the manner in which a high side output connection for the dual MOSFET switch of FIG. 1 may be effected with reverse current blocking and nominal insertion loss.

FIG. 11 diagrammatically illustrates the manner in which a high side output connection for the dual MOSFET switch of FIG. 1 may be effected with reverse current blocking and nominal insertion loss. As shown therein, and in a complementary manner to the circuit connections of FIG. 10, described above, input/output port 2 is coupled to DC supply source 62 (referenced to ground), while input/output port 9 is coupled through load resistor 61 to ground. As in FIG. 10, this connection has the effect of placing the source-drain paths of the two MOSFETs 20 and 30 in series between input/output ports 2 and 9, so that the effective insertion resistance is 2Rdson. However, with the two MOSFETs in series, their body diodes are in opposite directions, as shown in FIG. 1, discussed above, thereby providing the intended reverse blocking functionality.

LOW SIDE CURRENT MONITOR WITH NOMINAL INSERTION LOSS (FIG. 12)

Figure 12:
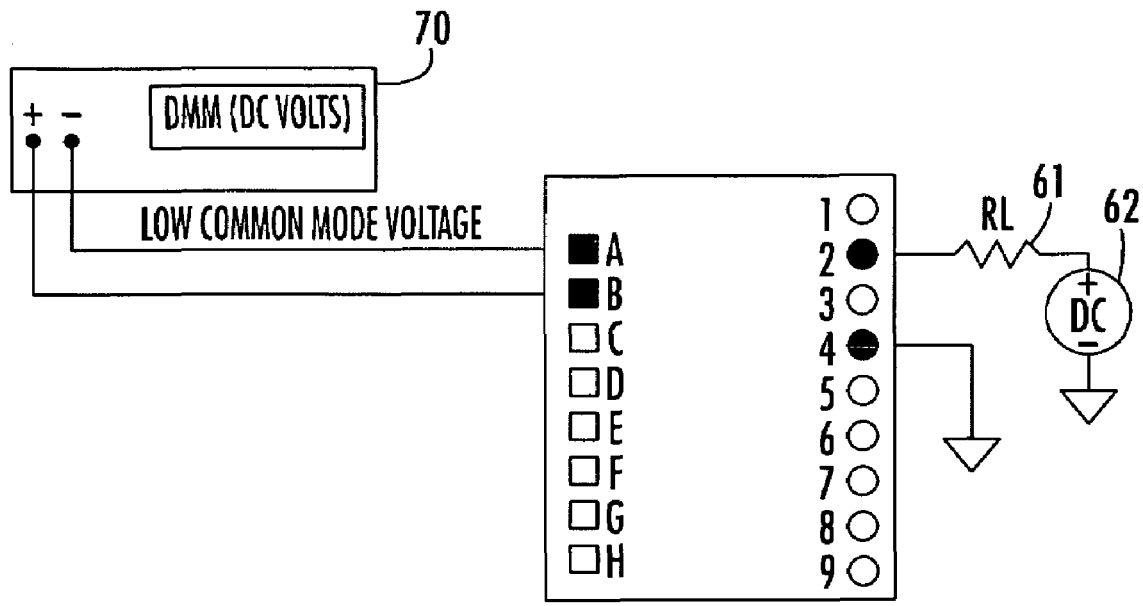
FIG. 12 diagrammatically illustrates the manner in which load current for the dual MOSFET switch of FIG. 1 may be monitored for a low side connection via a voltage monitoring device such as a digital multi-meter with nominal insertion loss.

FIG. 12 diagrammatically illustrates the manner in which load current for the dual MOSFET switch of FIG. 1 may be monitored for a low side connection via monitor ports A and B (shown as being connected to a voltage monitoring device 70 (such as a digital multi-meter (DMM)). On the input/output side of the switch, input/output port 2 is coupled through load resistor 61 to DC voltage supply 62, referenced to ground. Input/output port 4 is coupled directly to ground. As such the source-drain path of MOSFET 20 is coupled in series with resistor 34, which is switchably inserted between ports 2 and 4 by turning on MOSFET 20. The MOSFET switch insertion loss is that of the Rdson of MOSFET 20, and the nominal resistance of resistor 34 across which a voltage which represents the monitored current is measured.

HIGH SIDE CURRENT MONITOR WITH NOMINAL INSERTION LOSS (FIG. 13)

Figure 13:
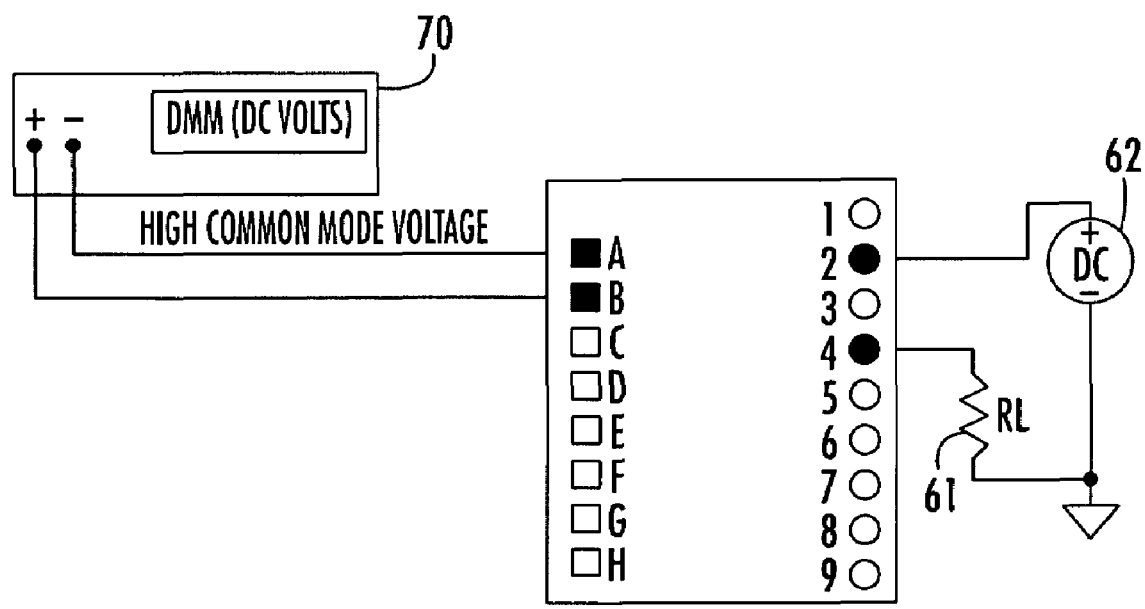
FIG. 13 diagrammatically illustrates the manner in which load current for the dual MOSFET switch of FIG. 1 may be monitored for a high side connection via a voltage monitoring device such as a digital multi-meter with nominal insertion loss.

FIG. 13 diagrammatically illustrates the manner in which load current for the dual MOSFET switch of FIG. 1 may be monitored for a high side connection via monitor ports A and B (shown as being connected to a voltage monitoring device 70 (such as a digital multi-meter (DMM)). On the input/output side of the switch, the input/output port 2 is coupled to DC voltage supply 62, referenced to ground, while the input/output port 4 is coupled through load resistor 61 to ground. As such the source-drain path of MOSFET 20 is again coupled in series with resistor 34, which is switchably inserted between ports 2 and 4 by turning on MOSFET 20. The MOSFET switch insertion loss is that of the Rdson of MOSFET 20, and the nominal resistance of resistor 34 across which a voltage which represents the monitored current is measured.

LOW SIDE CURRENT MONITOR WITH MINIMAL INSERTION LOSS (FIG. 14)

Figure 14:
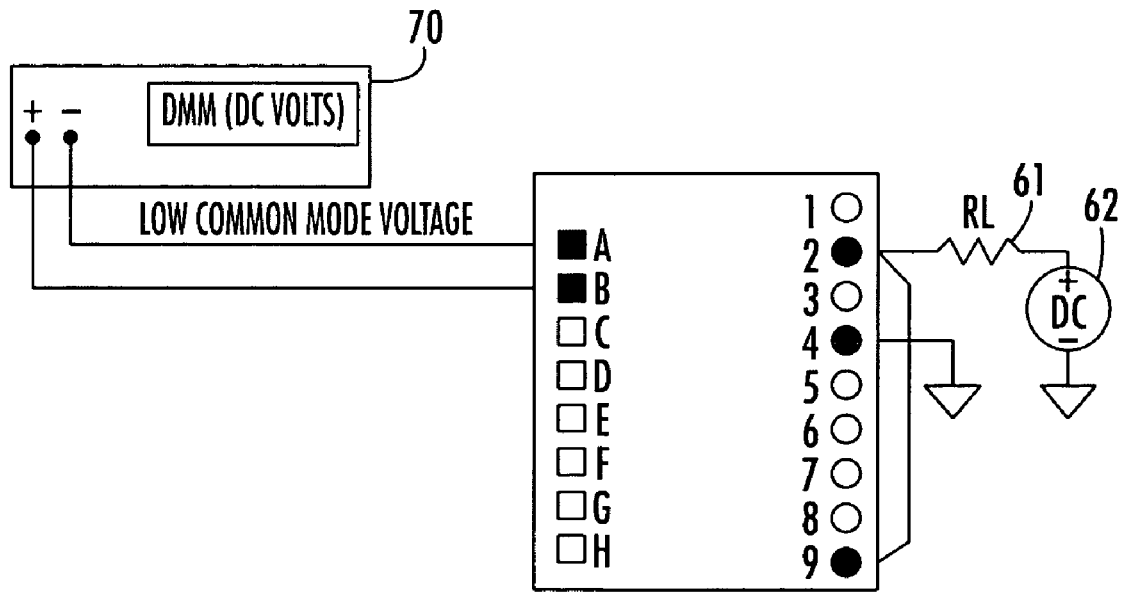
FIG. 14 diagrammatically illustrates the manner in which load current for the dual MOSFET switch to FIG. 1 may be monitored for a low side connection via a voltage monitoring device with minimal insertion loss.

FIG. 14 diagrammatically illustrates the manner in which load current for the dual MOSFET switch of FIG. 1 may be monitored via monitor ports A and B (again shown as being connected to a voltage monitoring device 70 (such as a digital multi-meter (DMM)), but with minimal insertion loss. On the input/output side of the switch, input/output port 2 is coupled through load resistor 61 to DC voltage supply 62, referenced to ground. Port 2 is also coupled to port 9, thereby placing the two MOSFETs in parallel. Input/output port 4 is again coupled directly to ground. As such, the parallel-connected source-drain paths of MOSFETs 20 and 30 are coupled in series with resistor 34, which is switchably inserted between ports 2 and 4 by turning on MOSFET 20. The MOSFET switch insertion loss is now Rdson/2, and the nominal resistance of resistor 34 across which a voltage which represents the monitored current is measured.

HIGH SIDE CURRENT MONITOR WITH MINIMAL INSERTION LOSS (FIG. 15)

Figure 15:
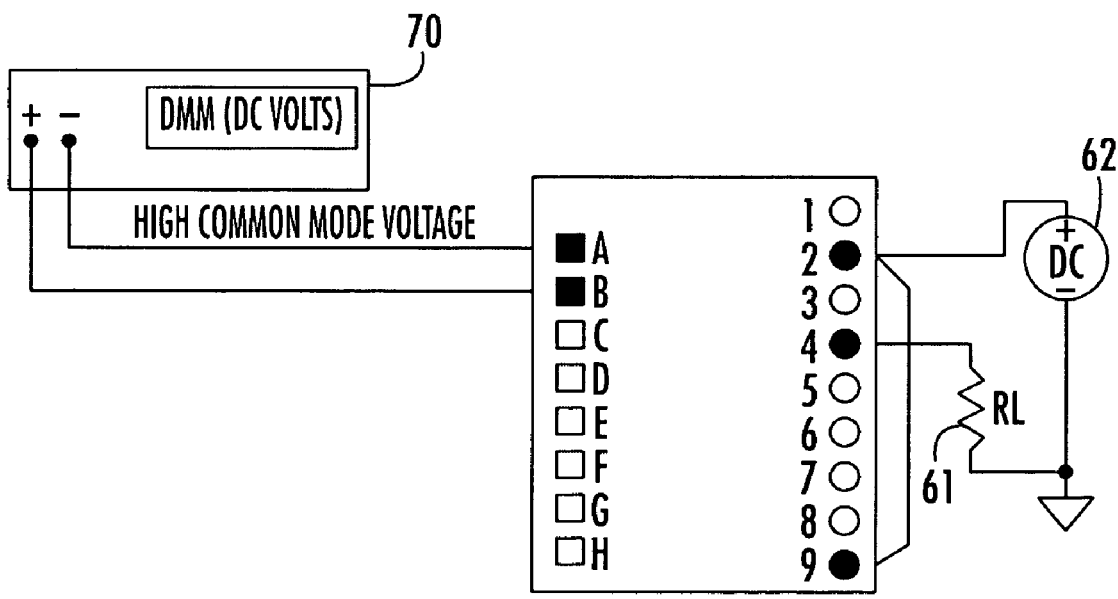
FIG. 15 diagrammatically illustrates the manner in which load current for the dual MOSFET switch of FIG. 1 may be monitored for a high side connection via a voltage monitoring device with minimal insertion loss.

FIG. 15 diagrammatically illustrates the manner in which load current for the dual MOSFET switch of FIG. 1 may be monitored via monitor ports A and B connected to a digital multi-meter 70, but with minimal insertion loss. As in FIG. 14, on the input/output side of the switch, the input/output port 2 is coupled to DC voltage supply 62, referenced to ground, and also to port 9, thereby placing MOSFETs 20 and 30 in parallel. The input/output port 4 is coupled through load resistor 61 to ground. As such the parallel connected source-drain paths of MOSFETs 20 and 30 are coupled in series with resistor 34, which is switchably inserted between ports 2 and 4 by turning on MOSFET 20. The MOSFET switch insertion loss is Rdson/2, and the nominal resistance of resistor 34 across which a voltage which represents the monitored current is measured.

LOW SIDE CURRENT MONITOR WITH REVERSE CURRENT BLOCK (FIG. 16)

Figure 16:
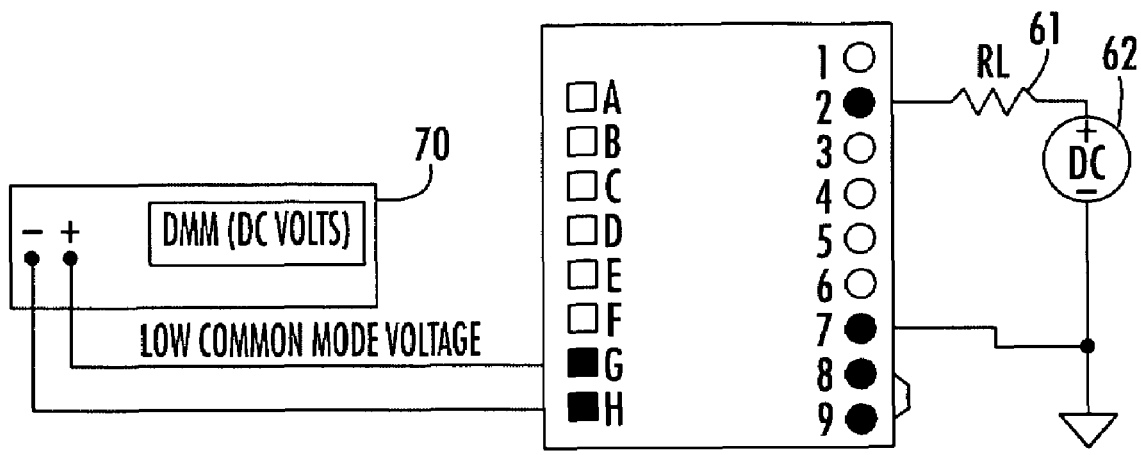
FIG. 16 diagrammatically illustrates the manner in which a low side load current path for the dual MOSFET switch of FIG. 1 may be monitored via monitor ports G and H.

FIG. 16 diagrammatically illustrates the manner in which a low side load current path for the dual MOSFET switch of FIG. 1 may be monitored via monitor ports G and H (shown as being connected to a voltage monitoring device 70 (such as a digital multi-meter (DMM)). On the input/output side of the switch, input/output port 2 is coupled through load resistor 61 to DC voltage supply 62, referenced to ground. Input/output port 7 is coupled directly to ground. In addition, input/output ports 8 and 9 are connected together. This has the effect of placing the two MOSFETs back-to-back between input/output ports 2 and 8 and in series with resistor 78, which is coupled between ports 7 and 8, as described above. The insertion loss is now twice and Rdson of an individual MOSFET, i.e., 2Rdson, plus the resistance of resistor 78. The current through resistor 78 produces a voltage drop thereacross which is monitored by the DMM 70. Because the two MOSFETs 20 and 30 are connected back-to-back, their body diodes are in opposite directions, as shown in FIG. 1, discussed above, thereby providing the intended reverse blocking functionality.

HIGH SIDE CURRENT MONITOR WITH REVERSE CURRENT BLOCK (FIG. 17)

Figure 17:
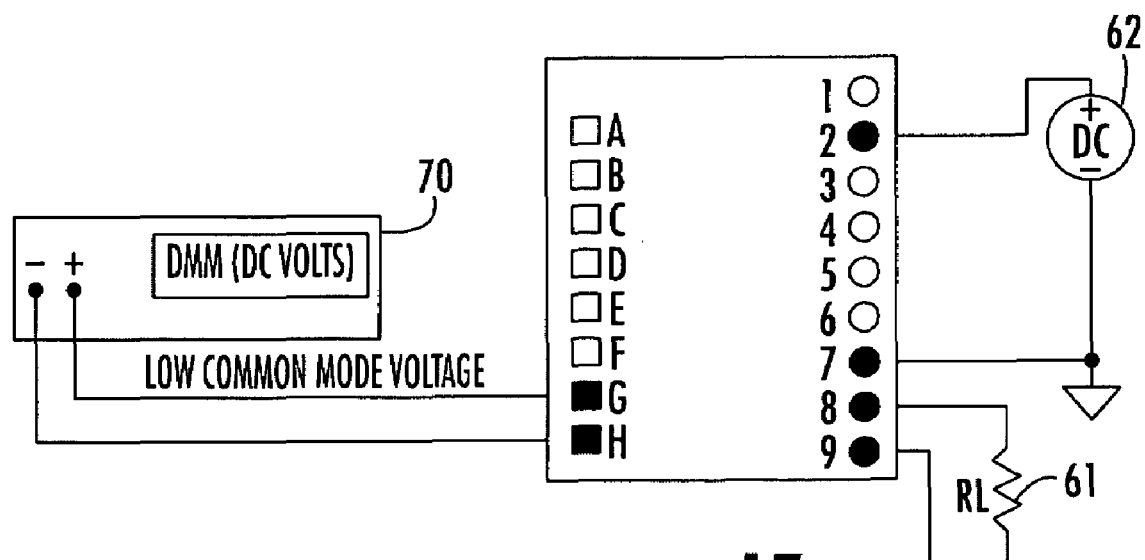
FIG. 17 diagrammatically illustrates the manner in which a high side load current path for the dual MOSFET switch of FIG. 1 may be monitored via monitor ports G and H.

FIG. 17 diagrammatically illustrates the manner in which a high side load current path for the dual MOSFET switch of FIG. 1 may be monitored via monitor ports G and H (shown as being connected to a voltage monitoring device 70 (such as a digital multi-meter (DMM)). On the input/output side of the switch, input/output port 2 is coupled directly to DC voltage supply 62, referenced to ground, while input/output port 7 is coupled to ground. In addition, the load resistor 61 is coupled across input/output ports 8 and 9. This again has the effect of placing the two MOSFETs in series between input/output ports 2 and 8 in series with resistor 78, which is coupled between ports 7 and 8, and in series with the load resistor 61, coupled across ports 8 and 9. The insertion loss is again twice the Rdson of an individual MOSFET, i.e., 2Rdson, plus the resistance of resistor 78. The current through resistor 78 produces a voltage drop thereacross which is monitored by the DMM 70. Because the two MOSFETs 20 and 30 are connected in series with their body diodes in opposite directions, as shown in FIG. 1, discussed above, the connection scheme of FIG. 17 provides the intended reverse blocking functionality.

Figure 18:
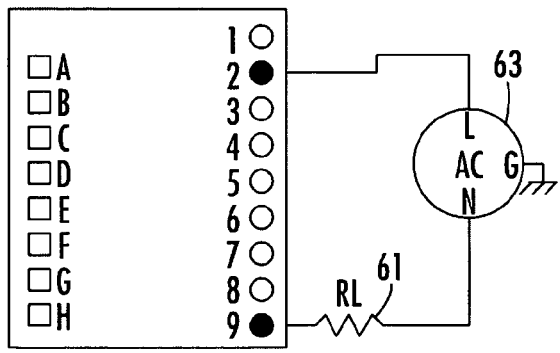
FIG. 18 diagrammatically illustrates the manner in which a line side AC switch connection for the dual MOSFET switch of FIG. 1 may be made with nominal insertion loss and without any current monitoring neon indicator excitation.

LINE SIDE AC SWITCH WITH NOMINAL INSERTION LOSS WITHOUT CURRENT MONITOR OR NEON INDICATOR (FIG. 18)

FIG. 18 diagrammatically illustrates the manner in which a line side AC switch connection for the dual MOSFET switch of FIG. 1 may be made with nominal insertion loss and without any current monitoring neon indicator excitation. In this connection state, input/output ports 2 and 9 are used to connected to the load 61 and AC source 63. As described above, and as can be seen from FIG. 1, this has the effect of placing the two MOSFETs 20 and 30 in series. Input/output port 2 is directly connected to the AC line voltage 63, while input/output port 9 is coupled to the neutral side via load resistor 61. With the two MOSFETs being in series, the effective insertion loss is 2Rdson.

Figure 19:
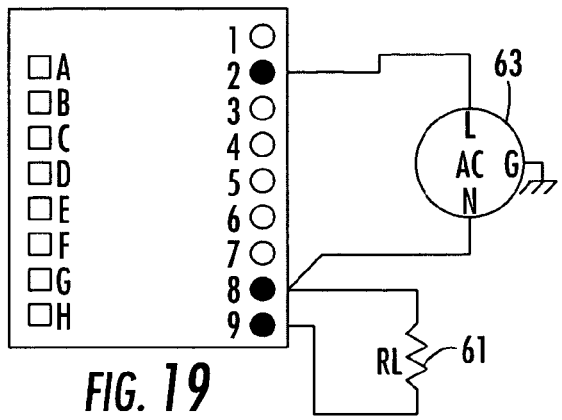
FIG. 19 diagrammatically illustrates an equivalent alternative connection scheme to that of FIG. 18 in which a line side AC switch connection may be made with nominal insertion loss and without any current monitoring neon indicator excitation.

LINE SIDE AC SWITCH WITH NOMINAL INSERTION LOSS WITHOUT CURRENT MONITOR OR NEON INDICATOR (FIG. 19)

FIG. 19 diagrammatically illustrates an equivalent alternative connection scheme to that of FIG. 18 in which a line side AC switch connection may be made with nominal insertion loss and without any current monitoring neon indicator excitation. In this connection state, input/output port 2 is directly connected to the AC line 63, while the load is coupled between input/output ports 8 and 9. Port 8 is coupled to the neutral side of the line voltage, and effectively serves as an alternative place to terminate the load resistor.

NEUTRAL SIDE AC SWITCH PATH WITH NOMINAL INSERTION LOSS (FIG. 20)

Figure 20:
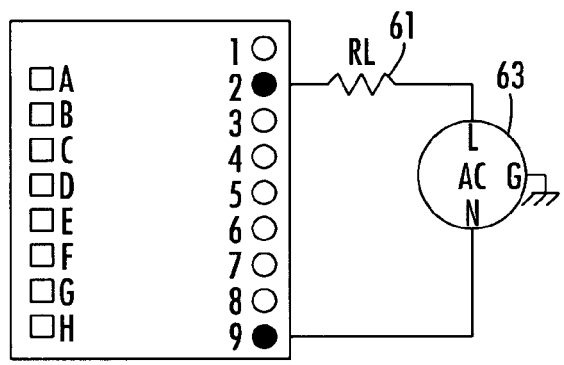
FIG. 20 diagrammatically illustrates a connectivity arrangement for the dual MOSFET switch of FIG. 1 complementary to that shown in FIG. 18.

FIG. 20 diagrammatically illustrates a connectivity arrangement for the dual MOSFET switch of FIG. 1 that is complementary to that shown in FIG. 18. In this connection state, input/output ports 2 and 9 are again used to connected to the load 61 and AC source 63. As described above, and as can be seen from FIG. 1, this has the effect of placing the two MOSFETs 20 and 30 in series. Input/output port 2 is connected through resistor 61 to the AC line voltage 63, while input/output port 9 is coupled to the neutral side of the line. With the two MOSFETs being in series, the effective insertion loss is again 2Rdson.

AC SWITCH PATH WITH CURRENT MONITOR (FIG. 21)

Figure 21:
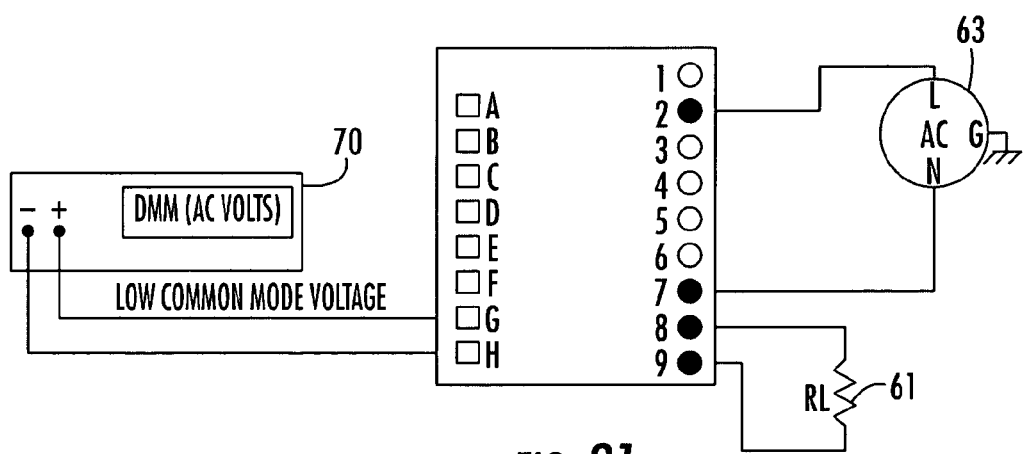
FIG. 21 shows an AC connection that is the same as that for the DC connection shown in FIG. 17, wherein current monitoring ports G and H are connected to a voltage monitoring device.

FIG. 21 shows an AC connection that is the same as that for the DC connection shown in FIG. 17, wherein current monitoring ports G and H are connected to a voltage monitoring device 70 (such as a DMM). On the input/output side of the switch, input/output port 2 is coupled directly to the line side of AC supply 63, while input/output port 7 is coupled to the neutral side. In addition, the load resistor 61 is coupled across input/output ports 8 and 9. This has the effect of placing the two MOSFETs in series between input/output ports 2 and 8 and in series with resistor 78, which is coupled between ports 7 and 8, and in series with the load resistor 61, coupled across ports 8 and 9. The insertion loss is again twice the Rdson of an individual MOSFET, i.e., 2Rdson, plus the resistance of resistor 78. The current through resistor 78 produces a voltage drop thereacross which is monitored by the DMM 70.

LINE SIDE AC SWITCH WITH NOMINAL INSERTION LOSS (FIG. 22)

Figure 22:
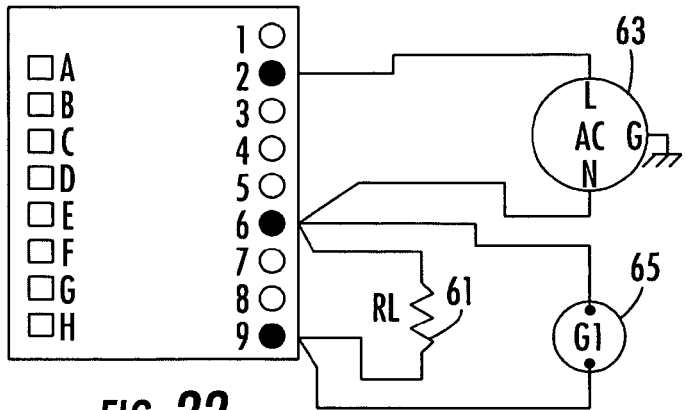

FIG. 22 diagrammatically illustrates the manner in which a (neon) lamp indicator 65 may coupled with the input/output ports to provide an indication of whether the switch for the dual MOSFET switch of FIG. 1 is turned on. Input/output port 2 is coupled to the line side of AC source 63, the neutral side of which is coupled to input/output port 6. The neon tube is coupled between input/output ports 6 and 9, and the load resistor 61 is coupled in parallel with the neon tube (across ports 6 and 9). With the AC voltage being coupled across input/output ports 2 and 9, the MOSFETs 20 and 30 are effectively placed in series therebetween, so that the insertion loss is 2Rdson.

LINE SIDE AC SWITCH WITH NOMINAL INSERTION LOSS (FIG. 23)

Figure 23:
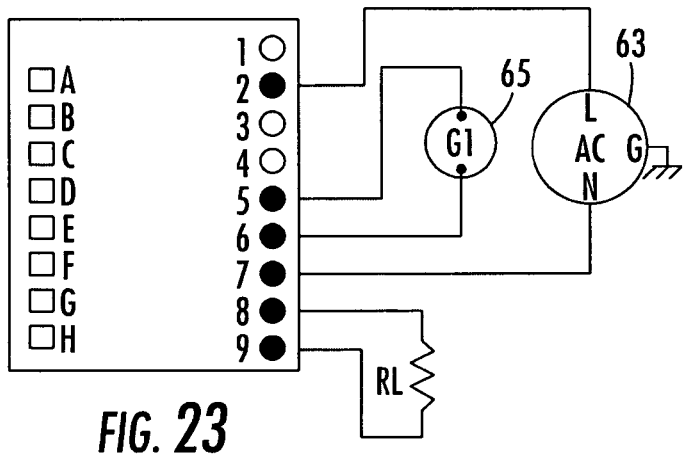
FIG. 23 diagrammatically illustrates coupling a neon lamp indicator across ports 5 and 6 for the switch of FIG. 1, while the AC source is coupled between input/output ports 2 and 7.

FIG. 23 diagrammatically illustrates coupling the neon lamp indicator 65 across ports 5 and 6 for the dual MOSFET switch of FIG. 1, while the AC source 63 is coupled between input/output ports 2 and 7. The load resistor 61 is coupled across ports 8 and 9. In this configuration, the insertion loss is again 2Rdson for the two series connected MOSFETs 20 and 30. The line voltage is now in series with this insertion loss and that of the resistor 78. As noted earlier, resistor 56 serves as MOSFET leakage current bypass path to prevent erroneous ignition of the gas tube.

LINE SIDE AC SWITCH WITH NOMINAL INSERTION LOSS (FIG. 24)

Figure 24:
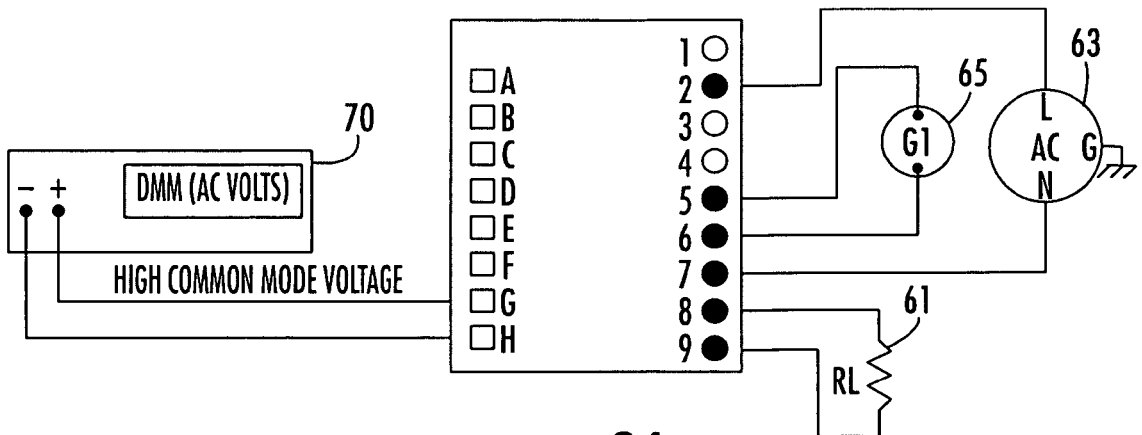
FIG. 24 diagrammatically illustrates the circuit connection arrangement of FIG. 23 with the addition of a multimeter to monitor the voltage across a resistor which bridges ports 7 and 8.

FIG. 24 diagrammatically illustrates the circuit connection arrangement of FIG. 23 with the addition of the DMM 70 to monitor the voltage across resistor 78, which bridges ports 7 and 8.

As will be appreciated from the foregoing description, problems of conventional solid state switches, including those described above, are successfully addressed by the multi-function, integrated solid state switch architecture of the invention, which is capable of switching either AC or DC voltages therethrough, while allowing current flow to a load to be readily monitored from the control side of the switch. The switch is also provided with an indicator that may be optionally wired to inform the user that a valid switch closure control signal has been applied to the switch.

While I have shown and described an embodiment in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A solid state switch architecture comprising:
a plurality of control/monitor ports;
a plurality of input/output ports;
a first solid state switching device having a first input/output node coupled to a first input/output port of said output plurality of input/output ports, a second input/output node coupled to a second input/output port of said plurality of input/output ports, and a control node;
a second solid state switching device having a first input/output node coupled to a third input/output port of said plurality of input/output ports, a second input/output node coupled to said second input/output port, and a control node coupled in common with the control node of said first solid state switching device; and
a solid state switching device driver circuit having a first input node coupled to a first control port of said plurality of monitor/control ports, a second input node coupled to a second control port of said plurality of monitor/control ports, and an output node coupled to the control nodes of said first and second solid state switching devices, said driver circuit being operative, in response to the application of a voltage differential to said first and second control ports, to turn on each of said first and second solid state switching devices, and thereby provide a first current flow path between said first and second input/output ports, a second current flow path between said second and third input/output ports, and a third current flow path between said first and third input/output ports.

2. The solid state switch architecture according to claim 1, further including an optical indicator device coupled between a third control port of said plurality of control/monitor ports and one of said first and second control ports, and being operative to provide an indication of the application of a voltage differential to said first and second control ports in response to said third control port being coupled to one of said first and second control ports.

3. The solid state switch architecture according to claim 2, further comprising a first resistor coupled between said second input/output port and a fourth input/output port of said plurality of input/output ports, and wherein connections are provided between opposite ends of said first resistor and first and second monitor ports of said plurality of control/monitor ports.

4. The solid state switch architecture according to claim 3, further comprising a second resistor coupled between fifth and sixth input/output ports of said plurality of input/output ports, and wherein connections are provided between opposite ends of said second resistor and third and fourth monitor ports of said plurality of control/monitor ports.

5. The solid state switch architecture according to claim 4, further comprising a third resistor coupled between said seventh and eighth input/output ports of said plurality of input/output ports, and wherein a connection is provided between said seventh input/output port and said third input/output port.

6. A method of controllably applying a voltage to a load comprising the steps of:
(a) providing a solid state switch architecture having:
a plurality of control/monitor ports,
a plurality of input/output ports,
a first solid state switching device having a first input/output node coupled to a first input/output port of said output plurality of input/output ports, a second input/output node coupled to a second input/output port of said plurality of input/output ports, and a control node, and
a second solid state switching device having a first input/output node coupled to a third input/output port of said plurality of input/output ports, a second input/output node control to said second input/output port, and a control node coupled in common with the control node of said first solid state switching device;
(b) coupling a load and a power source therefore to selected ones of said input/output ports; and
(c) applying a voltage differential to first and second control ports of said plurality of control/monitor ports, so as to turn on each of said first and second solid state switching devices, and thereby provide a current flow path through said first and second solid state switching devices, so as to place said load in circuit with said power source therefor by way of at least one of said first and second solid state switching devices and said selected ones of said input/output ports.

7. The method according to claim 6, wherein said power source comprises a DC power source.

8. The method according to claim 6, wherein said power source comprises an AC power source.

9. The method according to claim 6, further including the steps of:
(d) coupling an optical indicator device between said first and second control ports of said plurality of control/monitor ports, said optical indicator being operative to provide an indication of the application of a voltage differential to said first and second control ports.

10. The method according to claim 6, wherein a first resistor is coupled between said second input/output port and a fourth input/output port of said plurality of input/output ports, said load and said power source therefore are coupled in a circuit path including said fourth input/output port, and further including the step (d) of monitoring a voltage across said first resistor to derive a voltage representative of current through said load.

11. The method according to claim 10, wherein a second resistor is coupled between fifth and sixth input/output ports of said plurality of input/output ports, said load and said power source therefor are coupled in a circuit path including said fifth and sixth input/output ports, and further including the step (d) of monitoring a voltage across said second resistor to derive a voltage representative of current through said load.

12. The method according to claim 11, wherein a third resistor is coupled between said seventh and eighth input/output ports of said plurality of input/output ports, a connection is provided between said seventh input/output port and said third input/output port, and an indicator device is coupled between said seventh and eighth input/output ports.

13. A solid state switch architecture for controllably placing a load in circuit with a power source therefore comprising:
  a plurality of input/output ports, selected ones of which are adapted to be coupled to a circuit path containing said load and said power source;
  a plurality of control/monitor ports;
  a first solid state switching device having a first input/output node coupled to a first input/output port of said plurality of input/output ports, a second input/output node coupled to a second input/output port of said plurality of input/output ports, and a control node;
  a second solid state switching device having a first input/output node coupled to a third input/output port of said plurality of input/output ports, a second input/output node coupled to said second input/output port, and a control node coupled in common with the control node of said first solid state switching device; and
  a solid state switching device driver circuit having a first input node coupled to a first control port of said plurality of monitor/control ports, a second input node coupled to a second control port of said plurality of monitor/control ports, and an output node coupled to the control nodes of said first and second solid state switching devices, said driver circuit being operative, in response to the application of a voltage differential to said first and second control ports, to turn on each of said first and second solid state switching devices, and thereby provide a current flow path through at least one of said first and second solid state switching devices and said circuit path containing said load and said power source.

14. The solid state switch architecture according to claim 13, wherein said selected ones of said input/output nodes are adapted to be coupled to said circuit path containing said load and said power source so as to effectively place said first and second solid state switching devices in parallel and thereby minimizing insertion loss therethrough.

15. The solid state switch architecture according to claim 13, wherein said selected ones of said input/output nodes are adapted to be coupled to said circuit path containing said load and said power source, so as to effectively couple only one of said first and second solid state switching devices with said circuit path, thereby providing a nominal insertion loss through said only one solid state switching device.

16. The solid state switch architecture according to claim 13, wherein said selected ones of said input/output nodes are adapted to be coupled to said circuit path containing said load and said power source, so as to effectively couple both of said first and second solid state switching devices in series with said circuit path, thereby providing a nominal insertion loss through both of said solid state switching devices.

17. The solid state switch architecture according to claim 16, wherein said selected ones of said input/output nodes are adapted to be coupled to said circuit path containing said load and said power source, so as to effectively couple said first and second solid state switching devices in series with said circuit path, such that body diodes thereof are in opposite electrical directions.

18. The solid state switch architecture according to claim 13, further comprising a first resistor coupled between said second input/output port and a fourth input/output port of said plurality of input/output ports, and wherein connections are provided between opposite ends of said first resistor and first and second monitor ports of said plurality of control/monitor ports.

19. The solid state switch architecture according to claim 18, further comprising a second resistor coupled between fifth and sixth input/output ports of said plurality of input/output ports, and wherein connections are provided between opposite ends of said second resistor and third and fourth monitor ports of said plurality of control/monitor ports.

20. The solid state switch architecture according to claim 19, further comprising a third resistor coupled between said seventh and eighth input/output ports of said plurality of input/output ports, and wherein a connection is provided between said seventh input/output port and said third input/output port.

* * * * *